US012148779B2

(12) United States Patent
Offenberg et al.

(10) Patent No.: US 12,148,779 B2
(45) Date of Patent: Nov. 19, 2024

(54) DEVICE FOR AN IMAGE SENSOR, IMAGE SENSOR FOR AN OPTICAL CAMERA AND OPTICAL CAMERA

(71) Applicant: Infineon Technologies Dresden GmbH & Co. KG, Dresden (DE)

(72) Inventors: Dirk Offenberg, Dresden (DE); Ines Uhlig, Dresden (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 567 days.

(21) Appl. No.: 17/398,207

(22) Filed: Aug. 10, 2021

(65) Prior Publication Data

US 2022/0052095 A1    Feb. 17, 2022

(30) Foreign Application Priority Data

Aug. 11, 2020   (EP) ..................... 20190496

(51) Int. Cl.
*H01L 27/146*   (2006.01)
*H01L 31/0232*   (2014.01)

(52) U.S. Cl.
CPC .... *H01L 27/14627* (2013.01); *H01L 31/0232* (2013.01)

(58) Field of Classification Search
CPC ........... H01L 27/14627; H01L 31/0232; H01L 27/14625; H01L 27/1464; H04N 25/70
See application file for complete search history.

(56) References Cited

U.S. PATENT DOCUMENTS

| 2007/0053037 | A1 | 3/2007 | Kang |
| 2007/0069109 | A1 | 3/2007 | Lee |
| 2010/0188537 | A1 | 7/2010 | Hiramoto et al. |
| 2012/0202312 | A1* | 8/2012 | Suzuki .............. H01L 27/14687 257/E21.586 |
| 2012/0267741 | A1* | 10/2012 | Suzuki .............. H01L 27/14685 257/E31.127 |

FOREIGN PATENT DOCUMENTS

| JP | 2003243639 A | 8/2003 |
| KR | 20100067982 A | 6/2010 |
| WO | 2007097062 A1 | 8/2007 |

* cited by examiner

*Primary Examiner* — David Vu
(74) *Attorney, Agent, or Firm* — Murphy, Bilak & Homiller, PLLC

(57) ABSTRACT

A device for an image sensor is provided. The device includes a semiconductor device including a photo-sensitive region configured to generate an electric signal based on incident light. Additionally, the device includes an optical element including a first surface for receiving the incident light and a second surface opposite the first surface and turned towards the photo-sensitive region. The first surface and the second surface are tilted by a tilt angle relative to each other so as to modify a direction of propagation of the incident light passing through the optical element towards a center of the photo-sensitive region to compensate for a chief ray angle of the incident light.

20 Claims, 9 Drawing Sheets

DEVICE FOR AN IMAGE SENSOR, IMAGE SENSOR FOR AN OPTICAL CAMERA AND OPTICAL CAMERA

TECHNICAL FIELD

The present disclosure relates to imaging. In particular, examples relate to a device for an image sensor, an image sensor for an optical camera and an optical camera.

BACKGROUND

In an optical camera, the individual pixels in a pixel array are illuminated by light coming from an objective lens. The light from the objective lens is not reaching all pixels at the same angle. In particular, the light is not reaching each pixel at an angle of 90°. The Chief Ray Angle (CRA) of the light is transferred into the photo-sensitive part of the pixel (e.g. silicon material). Due to the CRA, the light reaches the photo-sensitive part of a neighboring pixel and causes crosstalk. Moreover, in case of front side illumination of the pixel array, the light needs to pass the dielectric stack for wiring the photo-sensitive part of the pixel such that the light is shadowed by wiring lines and does not completely reach the photo-sensitive part of the pixel.

SUMMARY

Hence, there may be a demand for improved guidance of incident light towards a photo-sensitive region.

The demand may be satisfied by the subject matter of the appended claims.

An example relates to a device for an image sensor. The device comprises a semiconductor device comprising a photo-sensitive region configured to generate an electric signal based on incident light. Additionally, the device comprises an optical element comprising a first surface for receiving the incident light and a second surface opposite the first surface and turned towards the photo-sensitive region. The first surface and the second surface are tilted by a tilt angle relative to each other so as to modify a direction of propagation of the incident light passing through the optical element towards a center of the photo-sensitive region to compensate for a chief ray angle of the incident light.

Another example relates to an image sensor for an optical camera. The image sensor comprises an array of photo-sensitive pixels, wherein the array of photo-sensitive pixels comprises a first pixel comprising a first device according to the proposed technology, and a second pixel comprising a second device according to the proposed technology. The first pixel is located at a smaller lateral distance to a center of the array than the second pixel. The tilt angle of the optical element of the first pixel is smaller than the tilt angle of the optical element of the second pixel.

A further examples relates to an optical camera comprising an image sensor according to the proposed technology. Additionally, the optical camera comprises one or more objective lenses configured to focus the incident light on the image sensor.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
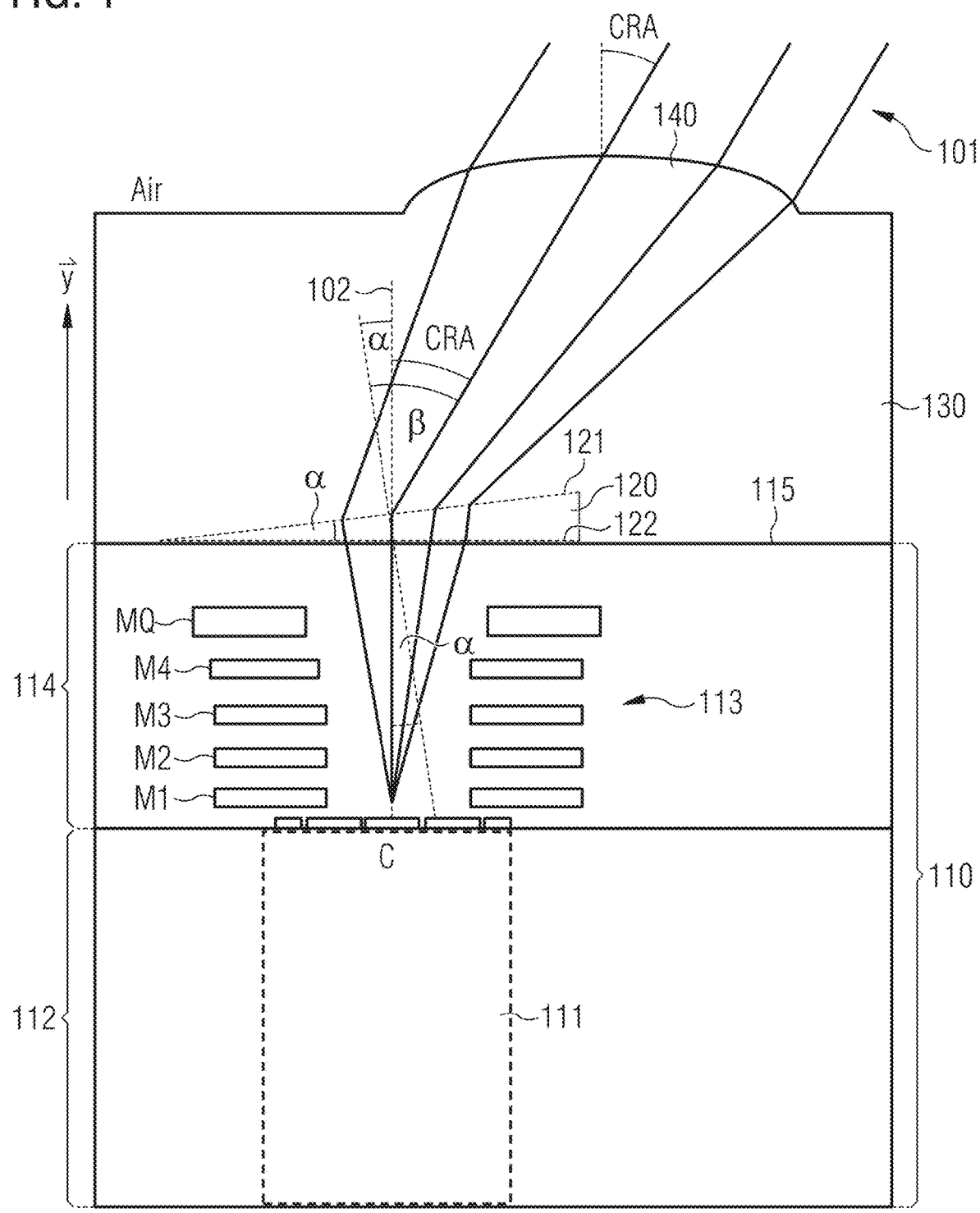
FIG. 1 illustrates a first example of a device for an image sensor.

FIG. 1 illustrates a device 100 for an image sensor of an optical camera. The device 100 comprises a semiconductor device 110 comprising a photo-sensitive region 111 formed in semiconductor material 112 of the semiconductor device 110. The photo-sensitive region 111 is configured to generate an electric signal based on incident (incoming) light 101. The photo-sensitive region 111 emits electrons or other charge carriers based on the inner photoelectric effect when the incident light 101 hits the semiconductor material of the photo-sensitive region 111. The emitted electrons or other charge carriers cause an electric signal, which depends on the incident light 101. The photo-sensitive region 111 may be sensitive to incident light 101 of any desired (target) wavelength. For example, the photo-sensitive region 111 may be sensitive to one or more of infrared light, visible light or ultraviolet light. The photo-sensitive region 111 (and also other parts of the semiconductor material 112) may be made up of any desired semiconductor material such as silicon or gallium arsenide.

In addition to the semiconductor material 112, the semiconductor device 100 may optionally comprise further layers or regions such as non-semiconductor material 114 illustrated in FIG. 1. For example, a metallization stack 113 comprising multiple metal layers M1, . . . , MQ may be formed in the non-semiconductor material 114 for electrically contacting the photo-sensitive region 111. For example, the metallization stack 113 may be used to couple a read-out circuit and/or a driver circuit (e.g. providing a bias or modulation signal for the photo-sensitive region 111) to the photo-sensitive region 111.

The incident light 100 is coming from an objective of the optical camera comprising one or more objective lenses. The optical axis of the optical camera/objective is indicated in FIG. 1 by dotted line 102. The optical axis of the optical camera is parallel to a thickness direction $\vec{y}$ of the semiconductor device 110. As can be seen from FIG. 1, the incident light 101 reaches the device 100 at an angle with respect to the optical axis 102. The angle of the incident light 101 with respect to the optical axis 102 is the CRA of the incident light 101.

In order to compensate for the CRA, the device 100 additionally comprises a dedicated optical element 120. The optical element 120 comprises a first surface 121 for receiving the incident light. Further, the optical element 120 comprises a second surface 122 opposite (to) the first surface 121. The second surface 122 is turned towards the photo-sensitive region 111. In other words, the second surface 122 faces the photo-sensitive region 111. As can be seen from FIG. 1, the second surface 122 is for emitting the incident light 101 towards the photo-sensitive region 111.

The first surface 121 and the second surface 122 are tilted by a tilt angle α relative to each other so as to modify a direction of propagation of the incident light 101 passing through the optical element 120 towards a center C of the photo-sensitive region 111 in order to compensate (at least in part) for the CRA of the incident light 101.

The optical element 120 allows to modify the direction of propagation of the incident light 101 towards the thickness direction $\vec{y}$ of the semiconductor device 110 such that the incident light 101 passing through the optical element 120 is focused to the center C of the photo-sensitive region 111. Accordingly, the direction of propagation of the incident light 101 is substantially parallel to the thickness direction $\vec{y}$ of the semiconductor device 110. Consequently, propagation of the incident light 101 to neighboring photo-sensitive regions may be avoided. Therefore, crosstalk between the photo-sensitive region 111 and neighboring photo-sensitive regions may be reduced. Furthermore, measures for suppressing crosstalk such as trenches in the semiconductor device 110 may be omitted. This allows reduced complexity and costs. Additionally, a thickness of the photo-sensitive region 111 (i.e. an extension along the thickness direction $\vec{y}$ of the semiconductor device 110) may be increased. This may allow to further reduce crosstalk between the photo-sensitive region 111 and neighboring photo-sensitive regions. In addition, shadowing by wiring lines of the metallization stack 113 may be avoided since the direction of propagation of the incident light 101 is substantially parallel to the thickness direction $\vec{y}$ of the semiconductor device 110 in the metallization stack 113 as well.

In the example of FIG. 1, the optical element 120 is arranged on a front surface 115 of the of the semiconductor device 110. In particular, the second surface 122 of the optical element 120 is formed on the surface 115 of the semiconductor device 110 such that the second surface 122 of the optical element 120 is parallel to the surface 115 of the semiconductor device 110.

As can be seem from FIG. 1, a lateral position of the optical element 120 is substantially equal to a lateral position of the photo-sensitive region 111. The lateral extension of the optical element 120 partly overlaps with the lateral extension of the photo-sensitive region 111.

The refractive indexes of the optical element 120 and material contacting the optical element 120 are different from each other such that the optical element 120 changes the direction of propagation of the incident light 101 towards the center C of the photo-sensitive region 111 by optical refraction. In the example of FIG. 1, the semiconductor device 110 and an oxide layer 130 formed on the semiconductor device 110 are contacting the optical element 120. Therefore, the refractive index $\eta_{OE}$ of the optical element 120 is different from the refractive index $\eta_{SD}$ of the semiconductor device 110 and the refractive index $\eta_{OL}$ of the oxide layer 130. For example, the oxide layer 130 partially enclosing the optical element 120 may be made up of silicon oxide such that $\eta_{OL}=1.46$. The optical element 120 may, e.g., be made up of material exhibiting a higher refractive index than silicon oxide such as silicon nitride, polysilicon, amorphous silicon, monocrystalline silicon or polymer materials. For example, the optical element 120 may be made up of amorphous silicon such that $\eta_{OE}=3.6$. In other examples, material exhibiting a lower refractive index than silicon oxide (or any other material enclosing the optical element 120) may be used. In alternative examples, the optical element 120 may enclose a cavity (not illustrated in FIG. 1) which is evacuated (empty, under vacuum) or filled with a predefined gas (air or other gases).

The tilt angle α is related to the CRA and the refractive indexes of the material contacting the optical element 120. The angle β shown in FIG. 1 indicates the angle of the incident light 101 with respect to a surface normal 123 of the first surface 121 and is defined as follows:

$$\beta = CRA + \alpha \quad (1)$$

Taking into account the above definition of the angle β, the tilt angle α may be determined as follows using Snell's law:

$$\eta_{OL} \cdot \sin \beta = \eta_{OE} \cdot \sin \alpha \quad (2)$$

$$\eta_{OL} \cdot \sin(CRA + \alpha) = \eta_{OE} \cdot \sin \alpha \quad (3)$$

$$\alpha = \frac{\arcsin(\eta_{OL}/\eta_{OE})}{1 - \arcsin(\eta_{OL}/\eta_{OE})} \cdot CRA \quad (4)$$

In the example of FIG. 1, the optical element 120 is in part formed in the oxide layer 130 and arranged between the semiconductor device 110 and a microlens 140 for focusing the incident light 101 onto the first surface 121 of the optical element 120. The microlens 140 is a small lens with a diameter that is at maximum ten, five, three or less times the lateral extension of the photo-sensitive region 111. In the example of FIG. 1, the microlens 140 is formed by structuring the oxide layer 130, i.e. the microlens 140 is formed in the oxide layer 130. However, it is to be noted that the microlens 140 may alternatively be formed separate from the oxide layer 130. Further, it is to be noted that in other examples, the microlens 140 may be formed between the optical element 120 and the photo-sensitive region 111. In other words, the optical element 120 may be arranged above the microlens 140 according to some examples.

The optical element 120 may at least partly be covered with an antireflective film (coating) in order to suppress reflections of the incident light at the surface of the optical element 120.

Figure 2:
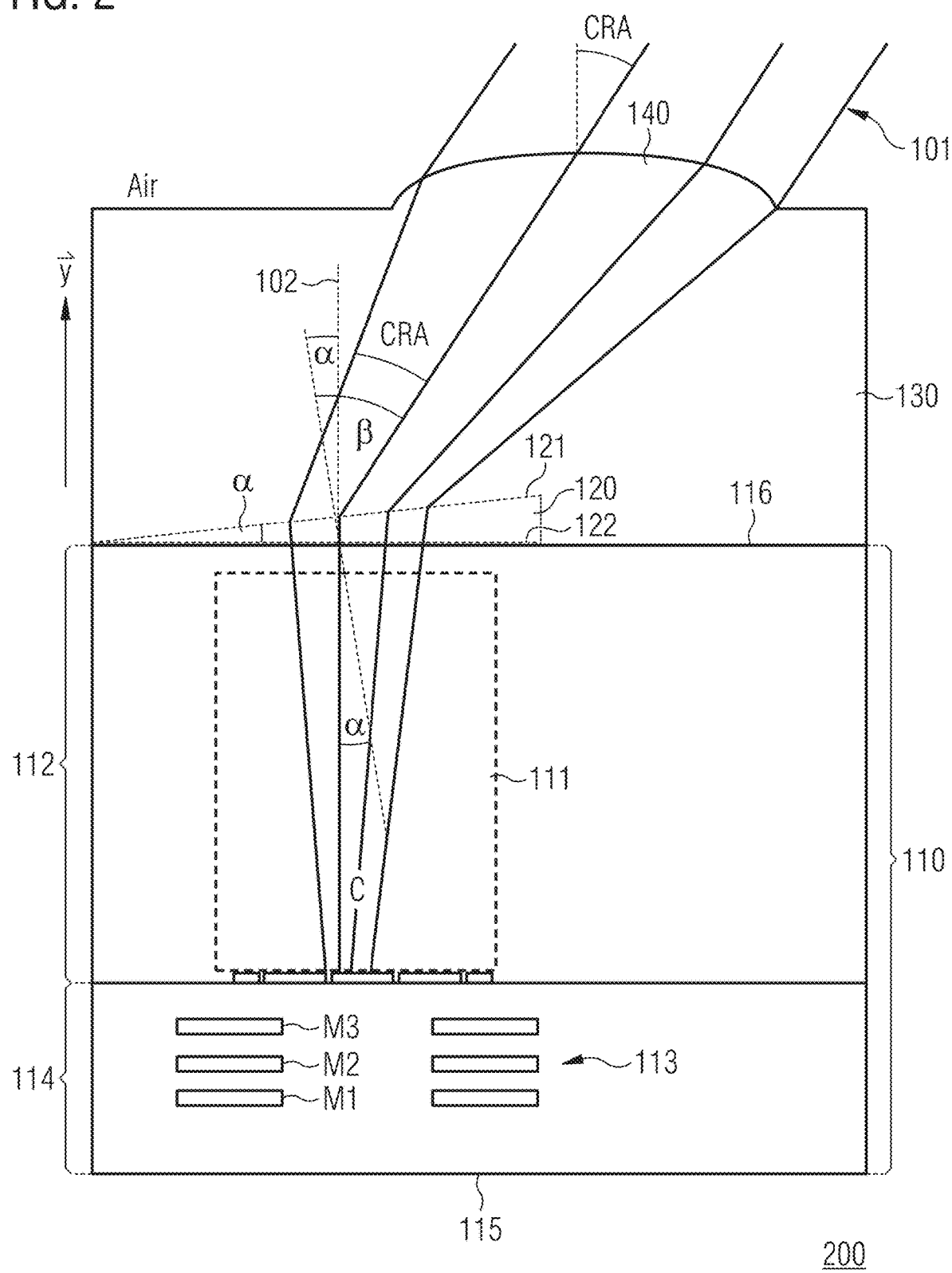
FIG. 2 illustrates a second example of a device for an image sensor.

The device 100 described above in connection with FIG. 1 is for front side illumination such that the metallization stack 113 is arranged between the photo-sensitive region 111 and the optical element 120 along the thickness direction $\vec{y}$ of the semiconductor device 110. However, the proposed technology for compensating the CRA of incident light may as well be used for back side illumination. This is shown in FIG. 2 illustrating another device 200 for an image sensor of an optical camera. In the example of FIG. 2, the optical element 120 is arranged (formed) on a back surface 116 of the of the semiconductor device 110. In contrast to the example of FIG. 1, the photo-sensitive region 111 is arranged between the metallization stack 113 and the optical element 120 in the device 200.

The oxide layer 130 is formed on the back surface 116 of the semiconductor device 110 and partially encloses the optical element 120, which is formed directly on top (e.g. as part) of the detector semiconductor material forming the photo-sensitive region 111 by tilting the surface of the photo-sensitive region 111.

Figure 3:
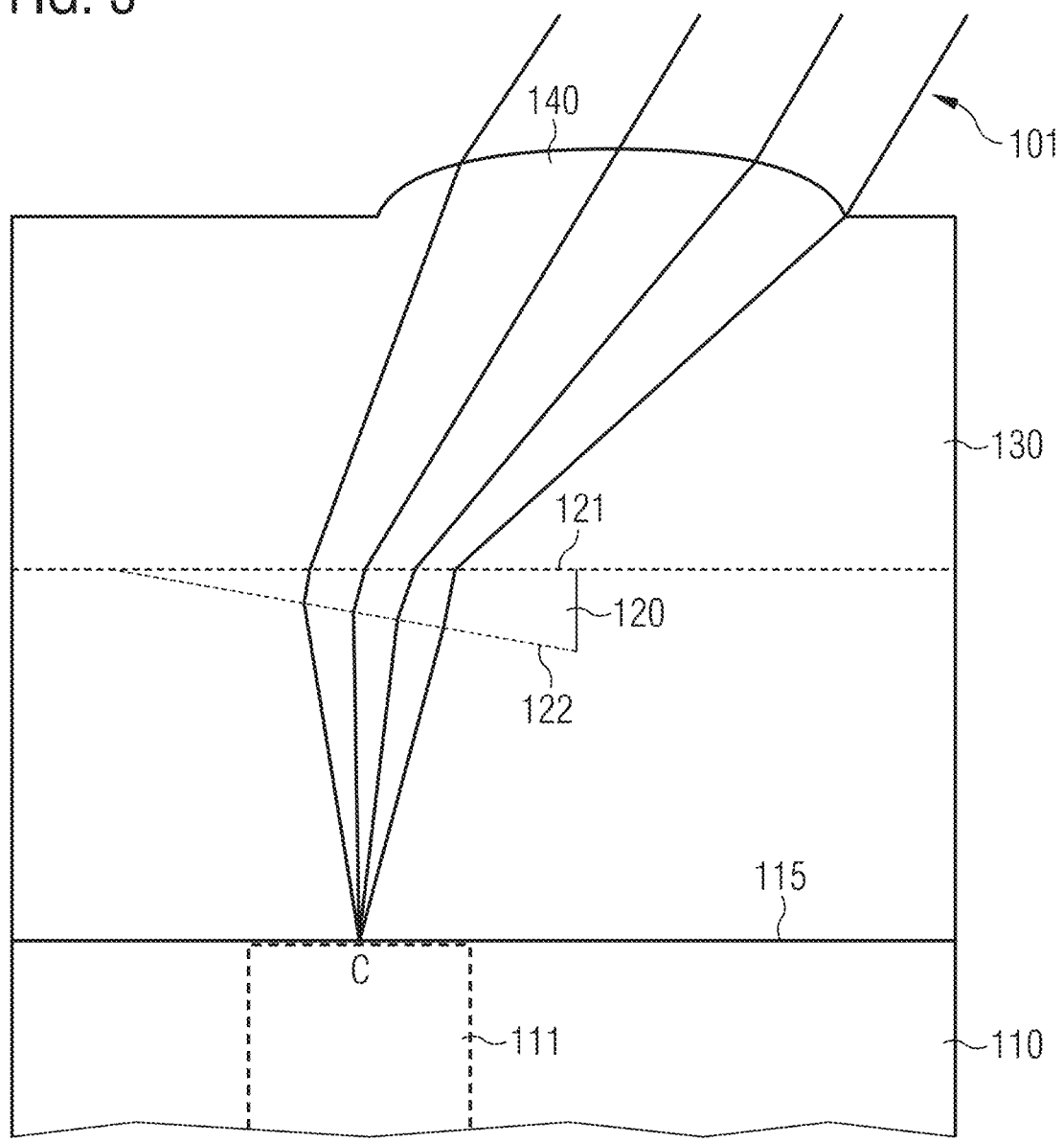
FIG. 3 illustrates a third example of a device for an image sensor.

In the examples of FIG. 1 and FIG. 2, the second surface 122 of the optical element 120 is parallel to the surface 115, 116 of the semiconductor device 110, whereas the first surface 121 of the optical element 120 is tilted with respect to the respective surface 115, 116 of the semiconductor device 110. However, the proposed technology is not limited thereto. FIG. 3 illustrates another device 300 for an image sensor of an optical camera according to the proposed technology. In contrast to the examples of FIG. 1 and FIG. 2, the first surface 121 of the optical element 120 is parallel to the surface 115 of the semiconductor device 110, whereas the second surface 122 of the optical element 120 is tilted with respect to the surface 115 of the semiconductor device 110.

Additionally, the optical element 120 is fully formed in the oxide layer 130 such that the oxide layer 130 fully encloses the optical element 120. The optical element 120 is arranged distant from the surface 115 of the semiconductor device 110 along the thickness direction $\vec{y}$ of the semiconductor device 110 contrary to the examples of FIG. 1 and FIG. 2 in which the optical element 120 is formed on the respective surface 115, 116 of the semiconductor device 110. Also the example of FIG. 3 allows to change to the direction of propagation of the incident light to the thickness direction 9 of the semiconductor device 110 in order to focus the incident light 101 passing through the optical element 120 towards the center C of the photo-sensitive region 111 for compensating the CRA of the incident light 101.

Figure 4:
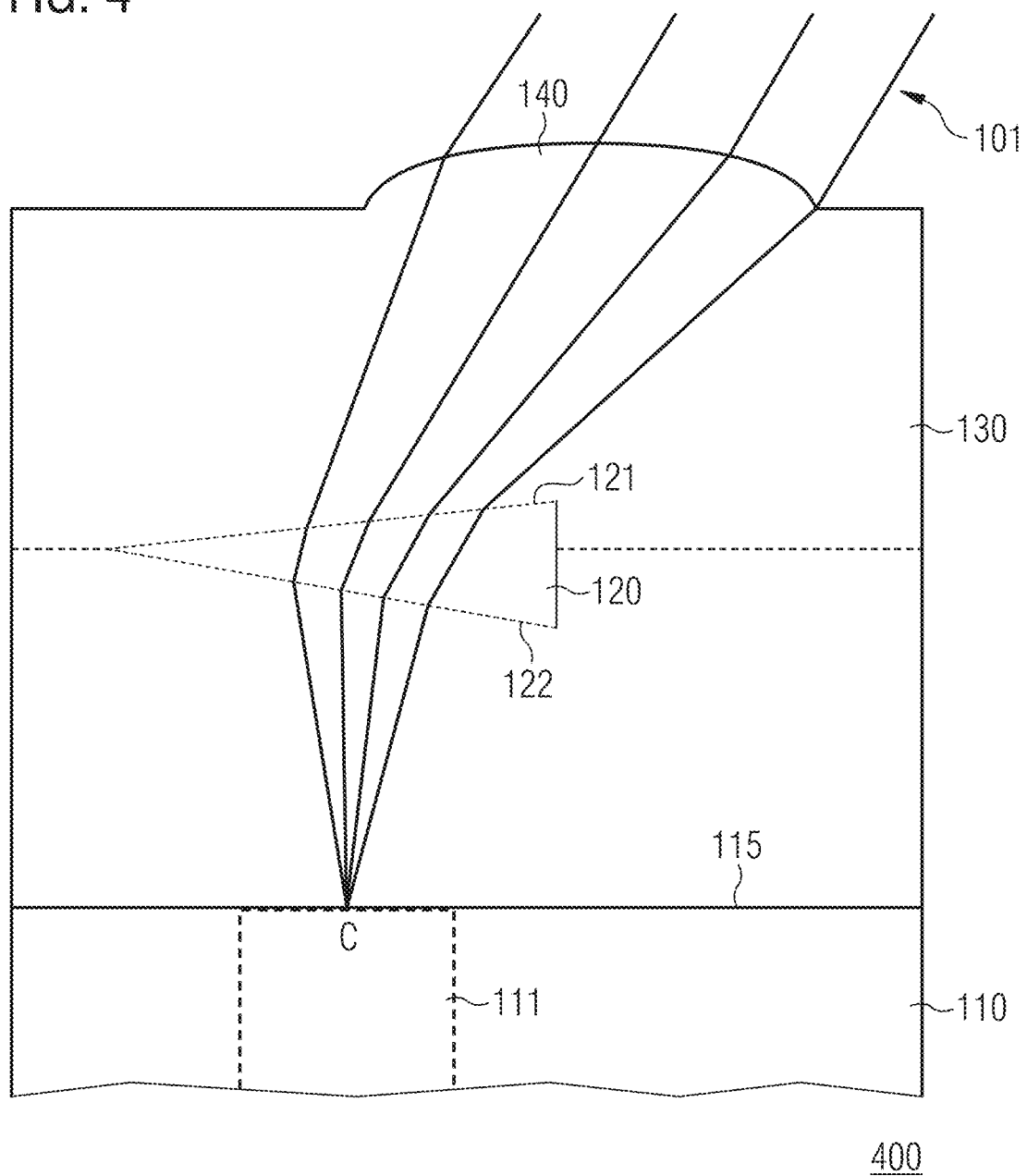
FIG. 4 illustrates a fourth example of a device for an image sensor.

FIG. 4 illustrates a further device 400 for an image sensor of an optical camera according to the proposed technology. The first surface 121 and the second surface 122 of the optical element 120 are both tilted with respect to the surface 115 of the semiconductor device 110 in the example of FIG. 4, i.e. none of the first surface 121 and the second surface 122 of the optical element 120 is parallel to the surface 115 of the semiconductor device 110. Similar to the example of FIG. 3, the optical element 120 is fully formed in the oxide layer 130 such that the optical element 120 is arranged distant from the surface 115 of the semiconductor device 110 along the thickness direction $\vec{y}$ of the semiconductor device 110.

Similar to the examples of FIG. 1 and FIG. 2, the lateral position of the optical element 120 is substantially equal to the lateral position of the photo-sensitive region 111 in the examples of FIG. 3 and FIG. 4. Again, the lateral extension of the optical element 120 partly overlaps with the lateral extension of the photo-sensitive region 111.

Figure 5:
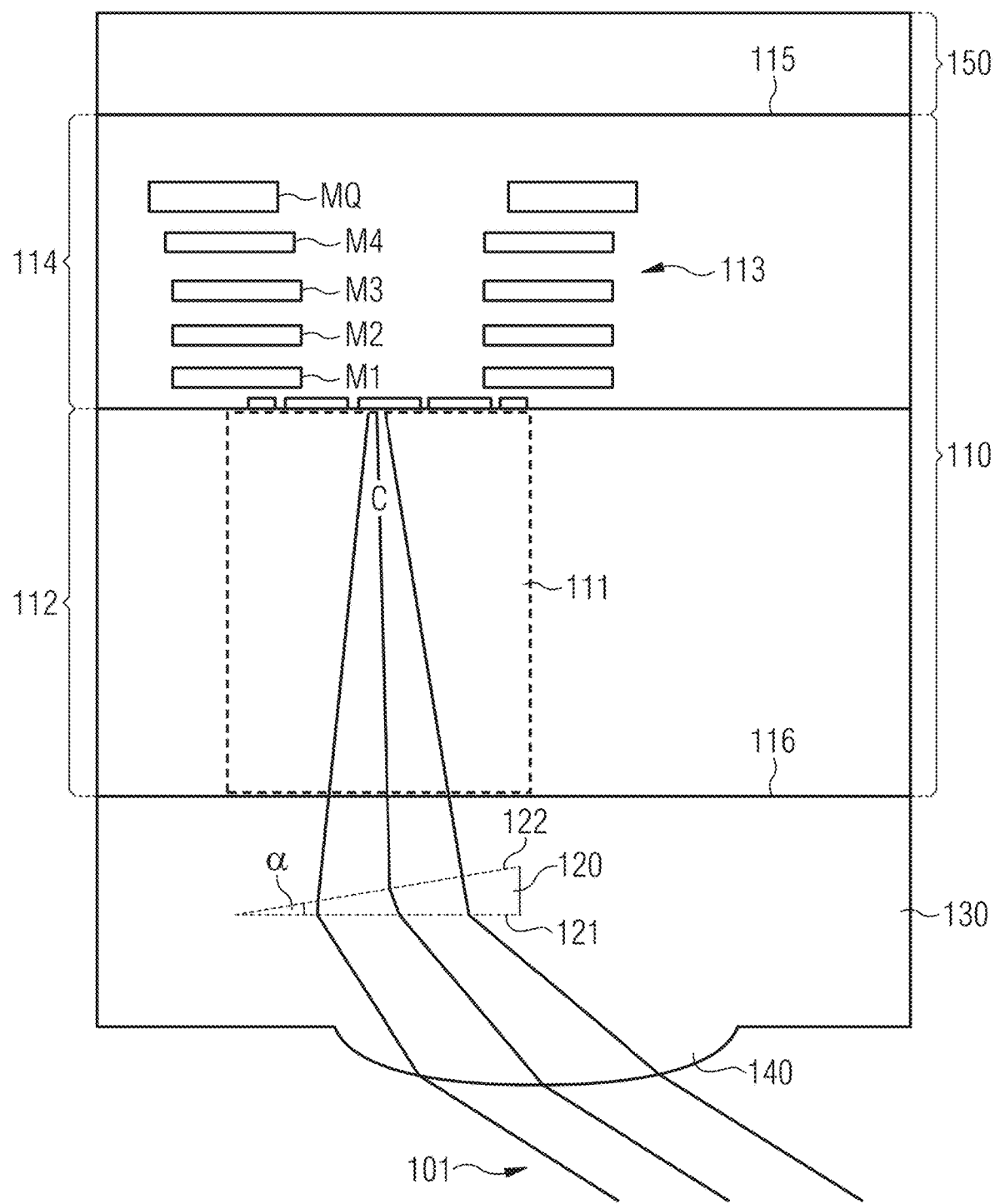
FIG. 5 illustrates a fifth example of a device for an image sensor.

FIG. 5 illustrates another device 500 for an image sensor of an optical camera according to the proposed technology. The device 500 is for back side illumination. The optical element 120 compensating the CRA of the incident light 101 is arranged distant from the back surface 116 of the semiconductor device 110. The metallization stack is arranged at the front surface 115 of the semiconductor device, which is covered by another oxide layer 150.

Figure 6A:
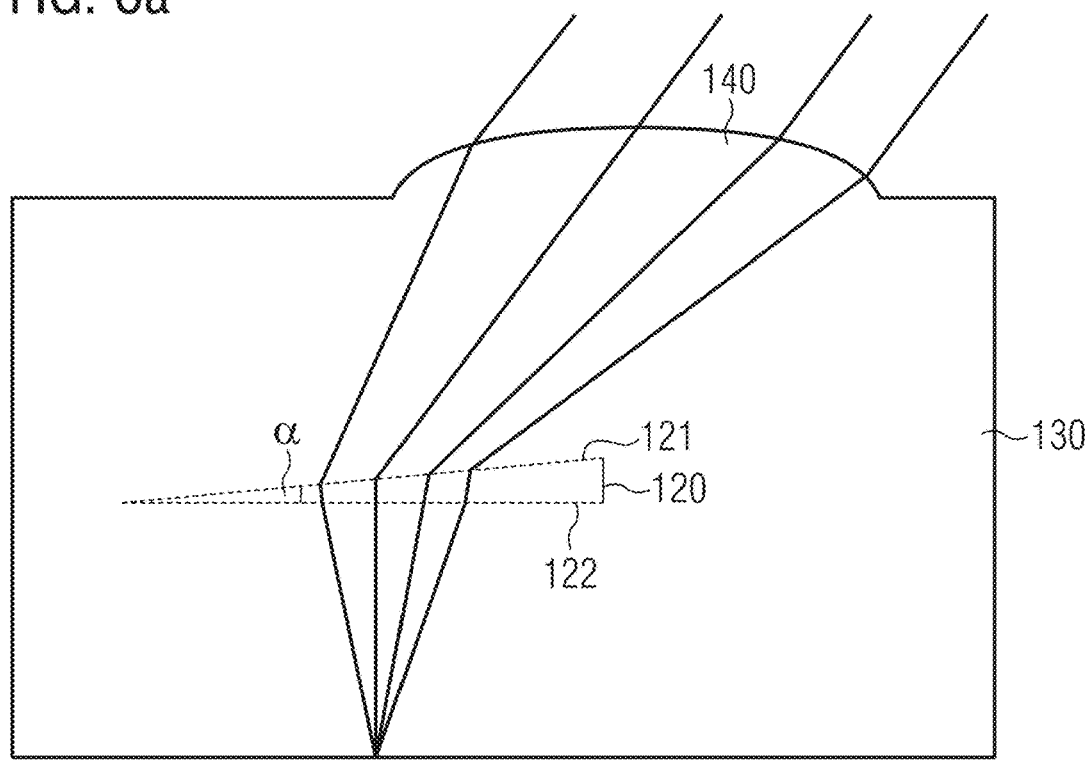
FIGS. 6a and 6b illustrate examples of the optical element.
Figure 6B:
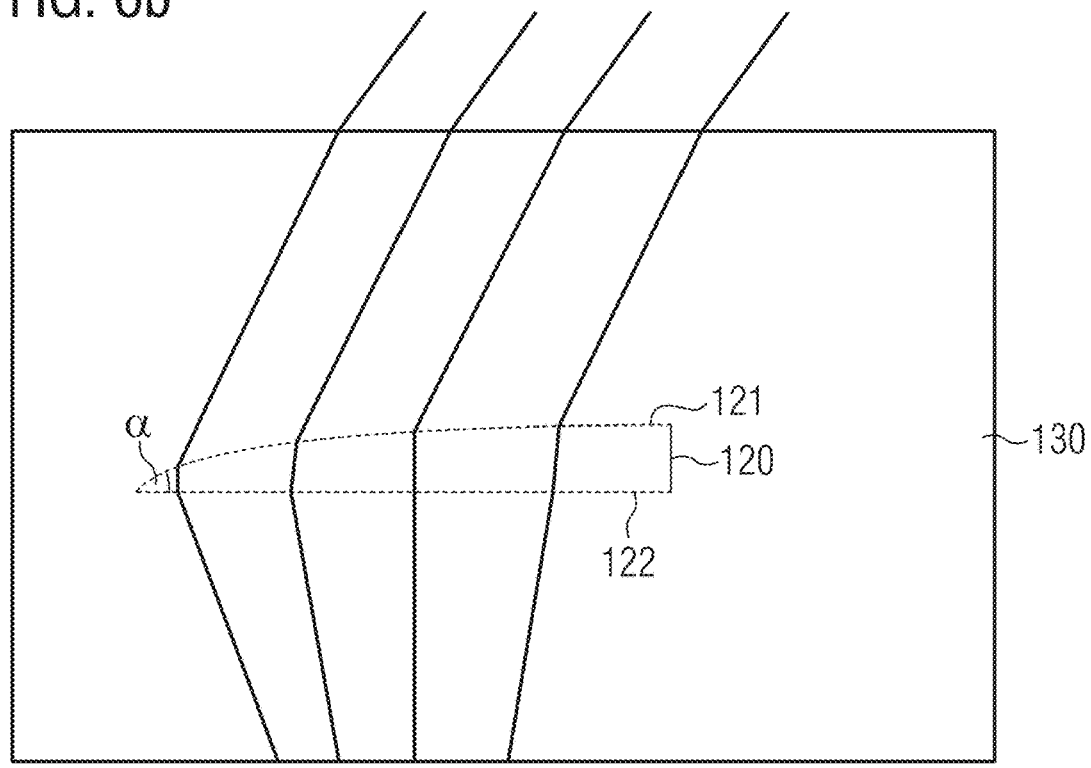

In the above examples, the optical element 120 was used together with the microlens 140 for focusing the incident light towards the center C of the photo-sensitive region 111 for compensating the CRA of the incident light 101. This is illustrated schematically in FIG. 6a. An alternative example implementing the functionality of the microlens 140 into the optical element 120 is illustrated in FIG. 6b. While the first surface 121 is a plane (even) surface in the example of FIG. 6a, the first surface 121 is a curved surface serving as a microlens in the example of FIG. 6b.

Figure 7:
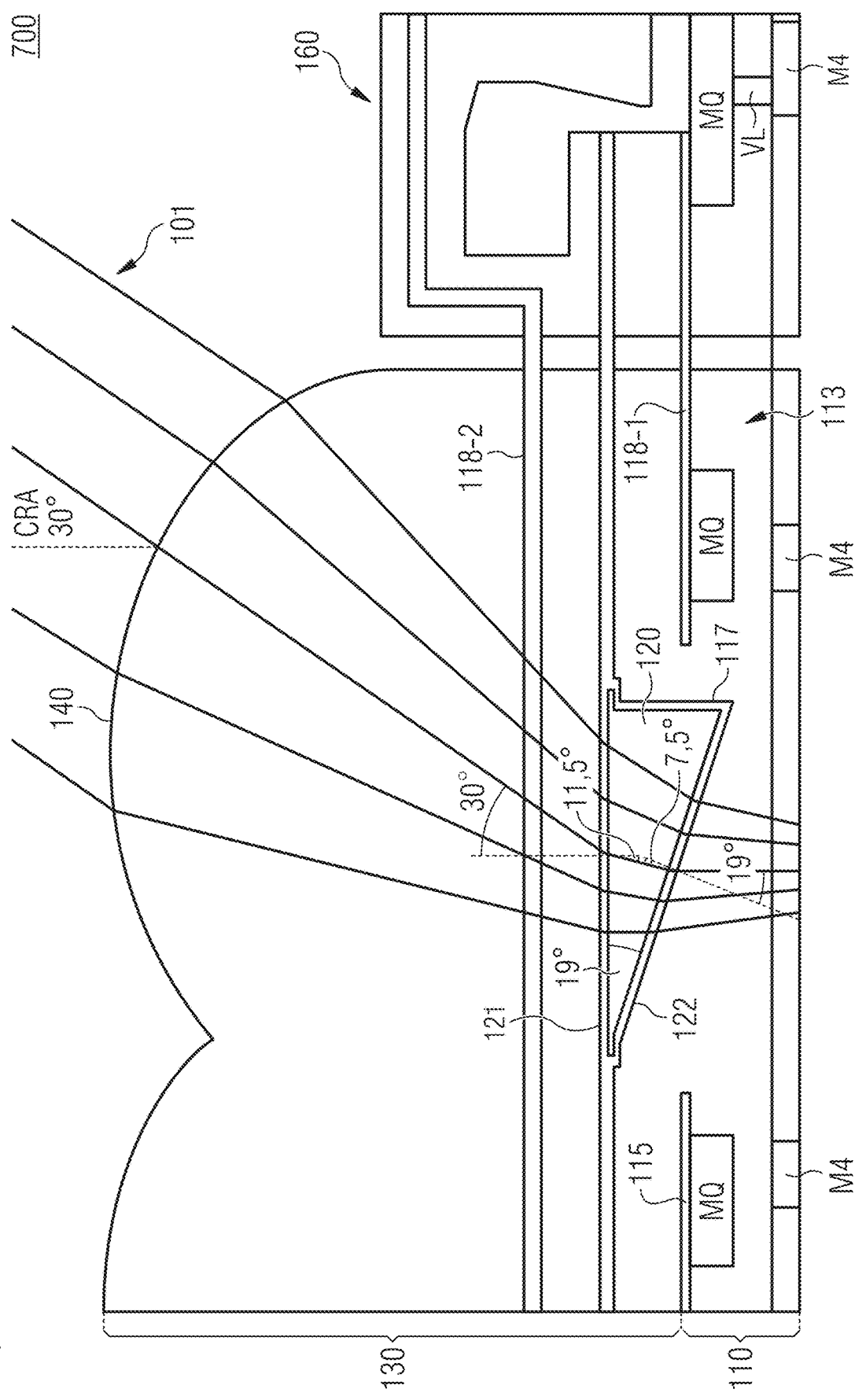
FIG. 7 illustrates a sixth example of a device for an image sensor.

FIG. 7 illustrates another device 700 for an image sensor of an optical camera according to the proposed technology. In the device 700, the optical element 120 is partially formed in a recess 117 in the front surface 115 of the semiconductor device 110. Accordingly, the second surface 122 of the optical element 120 extends partially in the recess 117 and partially in the oxide layer 130 formed on the front surface 115 of the semiconductor device 110.

Further, the optical element 120 is covered with an antireflective film 117 in order to mitigate reflections of the incident light at the surface of the optical element 120. In the example of FIG. 7, the antireflective film 117 is a nitride coating. However, it is to be noted that any other suitable antireflective coating may be used as well. Further, it is to be noted that according to some examples only part of the optical element 120 may be covered with the antireflective film 117.

Further illustrated are two passivation films 118-1 and 118-2 of nitride material for passivating the device 100. The passivation film 118-1 partially covers the front surface 115 of the semiconductor device 110, wherein the surface 115 is not covered by the passivation film 118-1 at the lateral position of the metallization stack 113, i.e. the lateral position of the photo-sensitive region (not illustrated). The passivation film 118-2 extends laterally between the optical element 120 and the microlens 140.

FIG. 7 further indicates the electrical contacting of the photo-sensitive area from the outside. A multilayer contact structure 160 coupling to the metallization stack 113 is illustrated in the right part of FIG. 7. The multilayer contact structure 160 is coupled to logic and driver circuitry for reading-out and driving (e.g. biasing or gating) the photo-sensitive region of the device 700.

The above described tilted surfaces of the optical element 120 may be generated using various processes of semiconductor fabrication. For example, for generating a tilted surface within resist material, grey-scale lithography may be used. Alternatively, a mechanical stamp technique may be used. Further, the tilted surfaces may be transferred to other materials by etch processes. Etch processes may allow to adjust (tune) the tilt angle. Further, more than one of the above described optical elements may be used for modifying the direction of propagation of the incident light towards the center of the photo-sensitive region in order to compensate for the CRA of the incident light.

Figure 8:
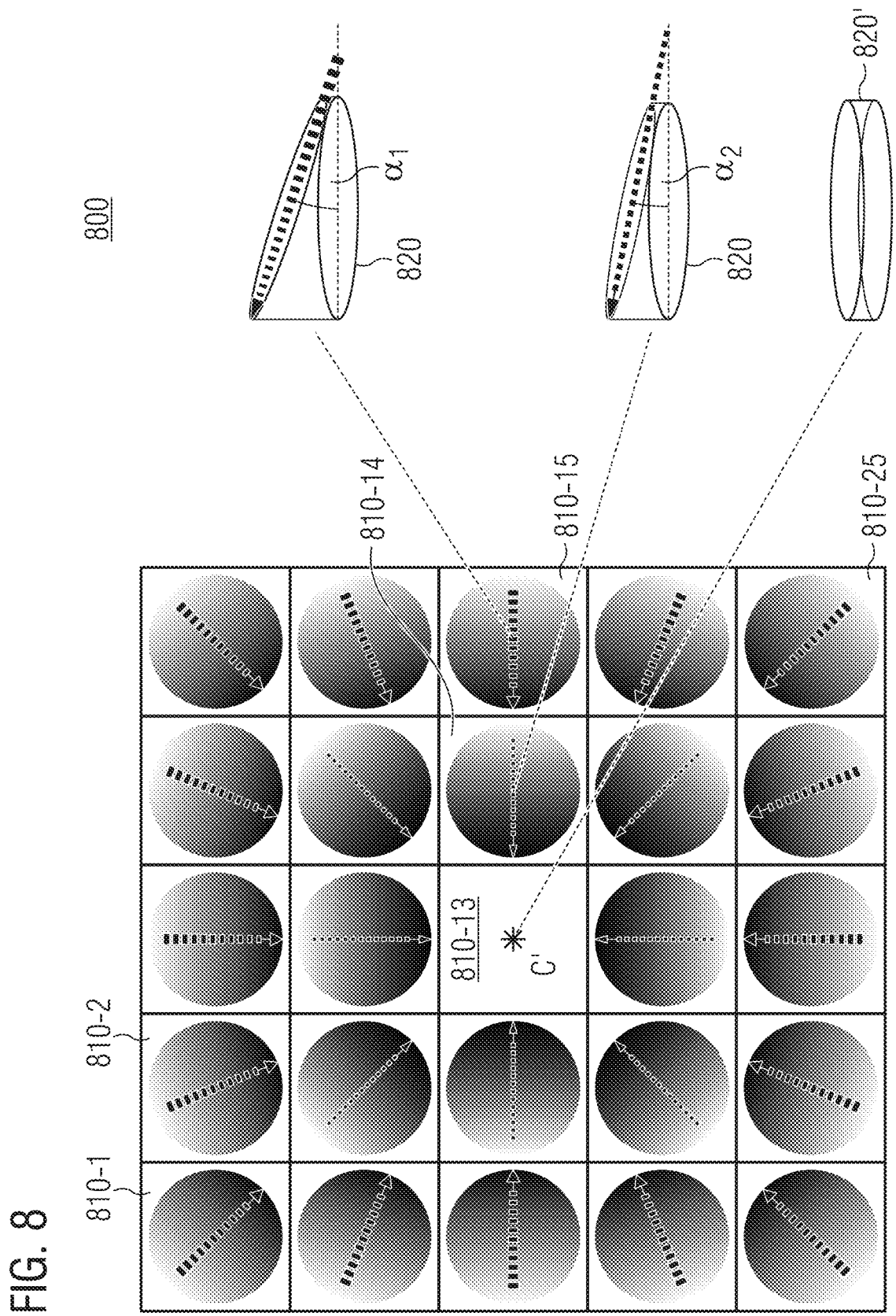
FIG. 8 illustrates an example of an image sensor.

An example of an image sensor 800 using the proposed technology is illustrated in FIG. 8. The image sensor 800 comprises an array of photo-sensitive pixels 810-1, 810-2, ..., 810-25. It is to be noted that the proposed technology is not limited to arrays comprising 25 photo-sensitive pixels as illustrated in FIG. 8. The number of photo-sensitive pixels illustrated in FIG. 8 is merely illustrative. In general, any number N≥2 of photo-sensitive pixels may be used.

Two or more of the photo-sensitive pixels 810-1, 810-2, ..., 810-25 use devices according to the proposed technology. In the example of FIG. 8, all of the photo-sensitive pixels 810-1, 810-2, ..., 810-25 use a respective device according to the proposed technology.

Further details of the image sensor 800 will be described in the following with reference to the photo-sensitive pixels 810-14 and 810-15, to which it is referred to as a first pixel and a second pixel.

The first pixel 810-14 comprise a first device as described above, whereas the second pixel 810-15 comprise a second device as described above.

The first pixel 810-14 and the second pixel 810-15 are located at different lateral distances to a center C' of the array. The CRA of the incident light reaching the first pixel 810-14 and the second pixel 810-15 generally depends on the position of the pixel within the array. In other words, the pixels 810-14 and 810-15 are illuminated with a different CRA. Therefore, the tilt angles of the first pixel 810-14 and the second pixel 810-15 are chosen different from each other. In particular, the tilt angles of the first pixel 810-14 and the second pixel 810-15 depend on the position of the respective pixel within the pixel array. As the first pixel 810-14 is located at a smaller lateral distance to the center C' of the array than the second pixel 810-15, the tilt angle $\alpha_1$ of the optical element 820 of the first pixel 810-14 is smaller than the tilt angle $\alpha_2$ of the optical element 820 of the second pixel 810-15. The refractive indexes of the optical elements of the first device and the second device are equal. In other words, the image sensor 800 uses an arrangement of tilted surfaces within the optical stack in order to transfer the incident light into the vertical direction by optical refraction.

The image sensor 800 may thus allow to compensate for the CRA of the incident light.

The optical elements 820 of individual pixels of the pixel array are oriented towards the center C of the array. Therefore, a thickness of the respective optical element increases for each of the first pixel 810-14 and the second pixel 810-14 with decreasing lateral distance to the center C' of the array as illustrated in FIG. 8. In other words, a distance between the first and second surface of the optical along the thickness direction of the semiconductor device holding the photo-sensitive area increases for each of the first pixel 810-14 and the second pixel 810-14 with decreasing lateral distance to the center C' of the array.

The pixel 810-13 located at the center C' of the array comprises an optical element 820' with a bottom surface and a top surface parallel to the surface of the below semiconductor device holding the photo-sensitive region as the CRA of the incident light is assumed to be 0° in the center C' of the array.

Figure 9:
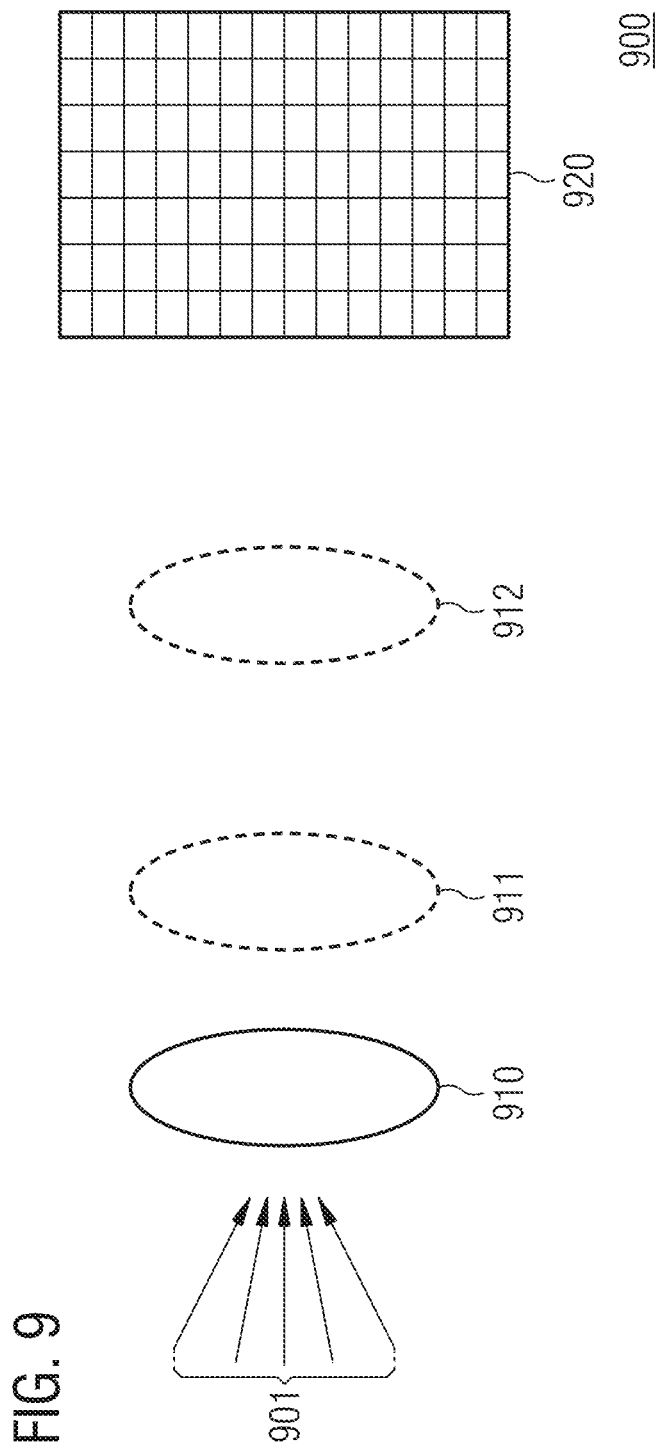
FIG. 9 illustrates an example of an optical camera.

A schematic example of an optical camera 900 using the proposed technology for compensating the CRA is illustrated in FIG. 9.

The optical camera 900 comprises an image sensor 920 as described above. Additionally, the optical camera comprises an objective with at least one objective lens 911 configured to focus incident light 901 on the image sensor 920. As indicated in FIG. 9, the optical camera 900 may comprise further objective lens 912, 913, . . . for focusing the incident light 901 on the image sensor 920.

The optical camera 900 may further comprise other hardware—conventional and/or custom. For example, the optical camera 900 may comprises circuitry for processing the electric signals output by the photo-sensitive regions of the individual pixels of the image sensor 920, or circuitry for driving (e.g. biasing or gating) the individual pixels of the image sensor 920.

The proposed technology may allow effective and cheap handling of large CRAs of the incident light focused on the image sensor 920 by compensating the CRA with optical refraction at the tilted surfaces of the optical elements. Conventional expensive approaches such as trenches for crosstalk suppression or back side illumination may be omitted. However, it is to be noted that the proposed technology may as well be used with back side illumination.

The optical camera 900 may be used for any kind of two-dimensional or three-dimensional image capturing. For example, the image sensor 920 may be a two-dimensional imager for visible or infrared light. In other examples, the image sensor 920 may be a three-dimensional imager for time-of-flight measurements.

The camera 900 may be of smaller size than conventional cameras because a higher CRA may be enabled without disadvantages such as crosstalk. For example, the available space, in particular the available height, for a camera is strictly limited in smartphones. Accordingly, the camera 900 may be suitable for smartphones as it may be built with small size. Moreover, the camera 900 may allow increased sensitivity as the thickness of the photo-sensitive region may be increased (see above). For example, if silicon is used as detector material for the photo-sensitive region and infrared light is to be detected, increasing the thickness of the photo-sensitive region may be beneficial because of the height penetration depth of infrared light in silicon.

The examples as described herein may be summarized as follows:

Some examples relate to a device for an image sensor. The device comprises a semiconductor device comprising a photo-sensitive region configured to generate an electric signal based on incident light. Additionally, the device comprises an optical element comprising a first surface for receiving the incident light and a second surface opposite the first surface and turned towards the photo-sensitive region. The first surface and the second surface are tilted by a tilt angle relative to each other so as to modify a direction of propagation of the incident light passing through the optical element towards a center of the photo-sensitive region to compensate for a chief ray angle of the incident light.

In some examples, one of the first surface and the second surface of the optical element is parallel to a surface of the semiconductor device.

In alternative examples, the first surface and the second surface of the optical element are both tilted with respect to a surface of the semiconductor device.

According to some examples, the optical element is arranged on a surface of the of the semiconductor device, or the optical element is arranged distant from the surface of the of the semiconductor device.

In some examples, a lateral extension of the optical element at least partly overlaps with a lateral extension of the photo-sensitive region.

According to some examples, refractive indexes of the optical element and material contacting the optical element are different from each other.

In some examples, the device further comprises a microlens configured to focus the incident light onto the first surface of the optical element.

In alternative examples, the first surface of the optical element is a curved surface serving as a microlens.

According to some examples, the device further comprises an oxide layer formed on the semiconductor device.

In some examples, the optical element is at least in part formed in the oxide layer such that the oxide layer at least partially encloses the optical element.

According to some examples, the optical element is fully formed in the oxide layer such that the oxide layer fully encloses the optical element.

According to alternative examples, the optical element is partially formed in a recess in a surface of the semiconductor device such that the second surface of the optical element extends partially in the recess and partially in the oxide layer.

According to further alternative examples, the second surface of the optical element is formed on a surface of the semiconductor device.

In some examples, refractive indexes of the optical element and the oxide layer are different from each other.

According to some examples, the optical element is at least partly covered with an antireflective film.

In some examples, the optical element encloses a cavity, and wherein the cavity is evacuated or filled with a pre-defined gas.

According to some examples, the device further comprises a metallization stack formed in a non-semiconductor material of the semiconductor device for electrically contacting the photo-sensitive region, wherein: the metallization stack is arranged between the photo-sensitive region and the optical element; or the photo-sensitive region is arranged between the metallization stack and the optical element.

Other examples relate to an image sensor for an optical camera. The image sensor comprises an array of photo-sensitive pixels, wherein the array of photo-sensitive pixels comprises a first pixel comprising a first device according to the proposed technology, and a second pixel comprising a second device according to the proposed technology. The first pixel is located at a smaller lateral distance to a center of the array than the second pixel. The tilt angle of the optical element of the first pixel is smaller than the tilt angle of the optical element of the second pixel.

In some examples, refractive indexes of the optical elements of the first pixel and the second pixel are equal.

Further examples relate to an optical camera comprising an image sensor according to the proposed technology. Additionally, the optical camera comprises one or more objective lenses configured to focus the incident light on the image sensor.

Examples according to the proposed technology may allow to compensate the CRA in an imager by means of an optical element.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A device for an image sensor, comprising:
    a semiconductor device comprising a photo-sensitive region configured to generate an electric signal based on incident light;
    an optical element comprising a first surface for receiving the incident light and a second surface opposite the first surface and turned towards the photo-sensitive region, wherein the first surface and the second surface are tilted by a tilt angle relative to each other so as to modify a direction of propagation of the incident light passing through the optical element towards a center of the photo-sensitive region to compensate for a chief ray angle of the incident light; and
    an oxide layer that is formed on the semiconductor device and at least partially encloses the optical element and fully covers the first surface of the optical element.

2. The device of claim 1, wherein one of the first surface and the second surface of the optical element is parallel to a surface of the semiconductor device.

3. The device of claim 1, wherein the first surface and the second surface of the optical element are both tilted with respect to a surface of the semiconductor device.

4. The device of claim 1, wherein the optical element is arranged on a surface of the semiconductor device, or wherein the optical element is arranged distant from the surface of the semiconductor device.

5. The device of claim 1, wherein a lateral extension of the optical element at least partly overlaps with a lateral extension of the photo-sensitive region.

6. The device of claim 1, wherein refractive indexes of the optical element and material contacting the optical element are different from each other.

7. The device of claim 1, further comprising a microlens configured to focus the incident light onto the first surface of the optical element.

8. The device of claim 1, wherein the first surface of the optical element is a curved surface serving as a microlens.

9. The device of claim 1, wherein the optical element is at least in part formed in the oxide layer.

10. The device of claim 9, wherein the optical element is fully formed in the oxide layer such that the oxide layer fully encloses the optical element.

11. The device of claim 9, wherein the optical element is partially formed in a recess in a surface of the semiconductor device such that the second surface of the optical element extends partially in the recess and partially in the oxide layer.

12. The device of claim 9, wherein the second surface of the optical element is formed on a surface of the semiconductor device.

13. The device of claim 9, wherein refractive indexes of the optical element and the oxide layer are different from each other.

14. An image sensor for an optical camera, wherein the image sensor comprises an array of photo-sensitive pixels, and wherein the array of photo-sensitive pixels comprises:
a first pixel comprising a first device; and
a second pixel comprising a second device,
wherein each of the first device and the second device comprises:
a semiconductor device comprising a photo-sensitive region configured to generate an electric signal based on incident light; and
an optical element comprising a first surface for receiving the incident light and a second surface opposite the first surface and turned towards the photo-sensitive region,
wherein, for each of the first device and the second device, the first surface and the second surface are tilted by a tilt angle relative to each other so as to modify a direction of propagation of the incident light passing through the optical element towards a center of the photo-sensitive region to compensate for a chief ray angle of the incident light, and
wherein the first pixel is located at a smaller lateral distance to a center of the array than the second pixel, and wherein the tilt angle of the optical element of the first pixel is smaller than the tilt angle of the optical element of the second pixel.

15. A device for an image sensor, comprising:
a semiconductor device comprising:
a photo-sensitive region formed in a semiconductor material of the semiconductor device and configured to generate an electric signal based on incident light; and
a metallization stack formed in a non-semiconductor material of the semiconductor device for electrically contacting the photo-sensitive region; and
an optical element comprising a first surface for receiving the incident light and a second surface opposite the first surface and turned towards the photo-sensitive region,
wherein the first surface and the second surface are tilted by a tilt angle relative to each other, so as to modify a direction of propagation of the incident light passing through the optical element towards a center of the photo-sensitive region to compensate for a chief ray angle of the incident light, and
wherein the photo-sensitive region is arranged between the metallization stack and the optical element.

16. The device of claim 15, wherein one of the first surface and the second surface of the optical element is parallel to a surface of the semiconductor device.

17. The device of claim 15, wherein the first surface and the second surface of the optical element are both tilted with respect to a surface of the semiconductor device.

18. The device of claim 15, wherein the optical element is arranged on a surface of the semiconductor device, or wherein the optical element is arranged distant from the surface of the semiconductor device.

19. The device of claim 15, wherein a lateral extension of the optical element at least partly overlaps with a lateral extension of the photo-sensitive region.

20. The device of claim 15, wherein refractive indexes of the optical element and material contacting the optical element are different from each other.

* * * * *